United States Patent
Beal et al.

(10) Patent No.: US 7,382,155 B2
(45) Date of Patent: *Jun. 3, 2008

(54) ENHANCED FIELD PROGRAMMABLE GATE ARRAY

(75) Inventors: Samuel W. Beal, Mountain View, CA (US); Sinan Kaptonoglu, San Carlos, CA (US); Jung-Cheun Lien, San Jose, CA (US); William Shu, Palo Alto, CA (US); King W. Chan, Los Altos, CA (US); William C. Plants, Santa Clara, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/916,214

(22) Filed: Aug. 10, 2004

(65) Prior Publication Data

US 2005/0081177 A1 Apr. 14, 2005

Related U.S. Application Data

(63) Continuation of application No. 09/819,084, filed on Sep. 25, 2000, now Pat. No. 6,791,353, which is a continuation of application No. 08/807,455, filed on Feb. 28, 1997, now Pat. No. 6,150,837.

(51) Int. Cl.
G06F 7/38 (2006.01)
H01L 27/10 (2006.01)
(52) U.S. Cl. ............................ 326/39; 326/38; 257/202

(58) Field of Classification Search ............... 326/39, 326/38, 37, 40, 41; 257/202, 203, 208, 209; 716/16, 17
See application file for complete search history.

(56) References Cited

U.S. PATENT DOCUMENTS

| | | | |
|---|---|---|---|
| 4,195,352 A | 3/1980 | Tu et al. | 364/900 |
| 4,458,163 A | 7/1984 | Wheeler et al. | 307/466 |
| 4,527,115 A | 7/1985 | Mehrotra et al. | 324/73 R |
| 4,609,986 A | 9/1986 | Hartmann et al. | 364/200 |
| 4,631,686 A | 12/1986 | Ikawa et al. | 364/490 |
| 4,638,187 A | 1/1987 | Boler et al. | 307/451 |

(Continued)

FOREIGN PATENT DOCUMENTS

EP 1229651 A2 4/2002

(Continued)

OTHER PUBLICATIONS

European Patent Application No. 02008838.1 Supplementary Search Report issued Jun. 16, 2005, based on U.S. Appl. No.: 08/807,455 filed Feb. 28, 1997.

(Continued)

*Primary Examiner*—Thomas Dickey
*Assistant Examiner*—Tan Tran
(74) *Attorney, Agent, or Firm*—Lewis and Roca, LLP

(57) ABSTRACT

An enhanced performance field programmable gate array integrated circuit comprises a field programmable gate array and other functional circuitry such as a mask-programmable gate array in the same integrated circuit. A circuit interface provides communication between the field programmable gate array, the mask-programmable gate array and the integrated circuit I/O.

20 Claims, 4 Drawing Sheets

U.S. PATENT DOCUMENTS

| | | |
|---|---|---|
| 4,677,318 A | 6/1987 | Veenstra ................... 307/465 |
| 4,684,830 A | 8/1987 | Tsui et al. .................. 307/465 |
| 4,691,161 A | 9/1987 | Kant et al. ................ 324/73 R |
| 4,713,792 A | 12/1987 | Hartmann et al. .......... 364/900 |
| 4,718,057 A | 1/1988 | Venkitakrishnan et al. ... 370/55 |
| 4,721,868 A | 1/1988 | Cornell et al. .............. 307/465 |
| 4,758,745 A | 7/1988 | Elgamal et al. ............. 307/465 |
| 4,758,747 A | 7/1988 | Young et al. ............... 307/465 |
| 4,771,285 A | 9/1988 | Agrawal et al. ....... 340/825.83 |
| 4,772,811 A | 9/1988 | Fujioka et al. .............. 307/465 |
| 4,774,421 A | 9/1988 | Hartmann et al. .......... 307/465 |
| 4,783,606 A | 11/1988 | Goetting ..................... 307/465 |
| 4,847,612 A | 7/1989 | Kaplinsky ............... 340/825.8 |
| 4,857,774 A | 8/1989 | El Ayat et al. .............. 307/465 |
| 4,870,302 A | 9/1989 | Freeman ..................... 307/465 |
| 4,873,459 A | 10/1989 | El Gamal et al. ........... 307/465 |
| 4,910,466 A | 3/1990 | Kiuchi et al. ............... 328/137 |
| 4,912,345 A | 3/1990 | Steele et al. ................ 307/465 |
| 4,928,023 A | 5/1990 | Marshall ..................... 307/443 |
| 4,930,097 A | 5/1990 | Ledenbach et al. ......... 364/716 |
| 4,931,671 A | 6/1990 | Agrawal ..................... 307/465 |
| 4,933,577 A | 6/1990 | Wong et al. ................. 307/465 |
| 4,933,898 A | 6/1990 | Gilberg et al. ................ 365/53 |
| 4,940,909 A | 7/1990 | Mulder et al. .............. 307/465 |
| 4,952,934 A | 8/1990 | Chiriatti ..................... 341/142 |
| 4,963,768 A | 10/1990 | Agrawal et al. ............ 307/465 |
| 4,969,121 A | 11/1990 | Chan et al. .................. 364/900 |
| 4,983,959 A | 1/1991 | Breuiniger ............ 340/825.83 |
| 4,992,680 A | 2/1991 | Benedetti et al. ........... 307/465 |
| 5,015,885 A | 5/1991 | El Gamal et al. ........... 307/465 |
| 5,023,484 A | 6/1991 | Pathak et al. ............... 307/465 |
| 5,027,011 A | 6/1991 | Steele ......................... 307/465 |
| 5,028,821 A | 7/1991 | Kaplinsky ................... 307/465 |
| 5,045,726 A | 9/1991 | Leung ........................ 307/465 |
| 5,068,603 A | 11/1991 | Mahoney ................ 324/158 R |
| 5,083,293 A | 1/1992 | Gilberg et al. .......... 365/189.01 |
| 5,107,146 A | 4/1992 | El Ayat ...................... 307/465 |
| 5,140,193 A | 8/1992 | Freeman et al. ............ 307/465 |
| 5,151,623 A | 9/1992 | Agrawal ..................... 307/465 |
| 5,153,462 A | 10/1992 | Agrawal et al. ............ 307/465 |
| 5,166,557 A | 11/1992 | Chen et al. .................. 307/468 |
| 5,172,014 A | 12/1992 | El Ayat et al. .............. 307/465 |
| 5,187,392 A | 2/1993 | Allen ......................... 307/465 |
| 5,187,393 A | 2/1993 | El Gamal et al. ........ 307/465.1 |
| 5,570,041 A | 10/1996 | El-Avat et al. |
| 5,687,325 A * | 11/1997 | Chang ........................ 710/104 |
| 5,754,826 A * | 5/1998 | Gamal et al. ................. 703/14 |
| 5,825,202 A * | 10/1998 | Tavana et al. ................ 326/39 |
| 5,881,245 A * | 3/1999 | Thompson .................. 709/219 |
| 6,150,837 A * | 11/2000 | Beal et al. .................... 326/39 |
| 6,791,353 B1 | 9/2004 | Beal et al. |

FOREIGN PATENT DOCUMENTS

| | | |
|---|---|---|
| EP | 1237280 A2 | 4/2002 |
| EP | 1237281 A2 | 4/2002 |
| EP | 1229652 A2 | 8/2002 |
| EP | 0901716 B1 | 2/2003 |
| JP | 06275718 A | 9/1994 |
| JP | 8069447 A | 3/1996 |
| JP | 3926398 B2 | 6/2007 |
| WO | 9516993 A1 | 6/1995 |
| WO | 9838741 A1 | 9/1998 |

OTHER PUBLICATIONS

European Patent Application No. 02008837.3. Supplementary Search Report issued Jun. 16, 2005, based on U.S. Appl. No.: 08/807,455 filed Feb. 28, 1997.

European Patent Application No. 02008839.9. Supplementary Search Report issued Jun. 16, 2005, based on U.S. Appl. No.: 08/807,455 filed Feb. 28, 1997.

European Patent Application No. 02008836.5. Supplementary Search Report issued Jun. 16, 2005, based on U.S. Appl. No.: 08/807,455 filed Feb. 28, 1997.

International Search Report and Written Opinion dated Sep. 3, 1998 based on PCT/US98/02280 from corresponding Published International Patent Application claiming priority to U.S. Appl. No. 08/807,455.

Fawcett, B. K., "Extending FPGA architectures to address new applications", Wescon/94, IDEA/Microelectronics Conference Record, Sep. 27-29, 1994, pp. 677-681, IEEE, New York, NY, USA.

Khan, U.R. et al., "FPGA architecture for ASIC hardware emulators", Proceedings of the Sixth Annual IEEE International ASIC Conference and Exhibit, Sep. 27 - Oct. 1, 1993, pp. 336-340, IEEE, New York, NY, USA.

"Mixture of Field and Factory Programmed Logic Cells in a Single Device," IBM Technical Disclosure Bulletin, vol. 38, No. 4, Apr. 1995, p. 499 XP002042363.

\* cited by examiner

ENHANCED FIELD PROGRAMMABLE GATE ARRAY

CROSS-REFERENCE TO RELATED APPLICATIONS

This application is a continuation of U.S. patent application Ser. No. 09/819,084, filed Sep. 25, 2000 now U.S. Pat. No. 6,791,353, which is a continuation of U.S. patent application Ser. No. 08/807,455, filed Feb. 28, 1997, now issued as U.S. Pat. No. 6,150,837.

BACKGROUND OF THE INVENTION

1. Field of the Invention

This invention relates to the field of Field Programmable Gate Arrays (FPGAs). In particular it relates to a method and apparatus of extending the functionality of FPGAs by providing a means for the inclusion of user-specified functions through inclusion of other functional circuitry on the integrated circuit die with the FPGA circuitry, and particularly with such circuitry implemented as mask programmable circuit regions on the integrated circuit.

2. The Prior Art

An integrated circuit uses a network of metal interconnects between the individual semiconductor components, which are patterned with standard photolithographic processes during wafer fabrication. Multiple levels of metallized patterns may be used to increase the flexibility of the interconnect.

It has long been recognized that a user-programmable interconnect technique or manufacturer programmability just prior to shipment would allow lower tooling costs and faster delivery time. To such an end, gate array circuits were developed.

A gate array circuit is an array of uncommitted gates with uncommitted wiring channels. To implement a particular circuit function, the circuit is mapped into the array and the wiring channels and appropriate connections are programmed to implement the necessary wiring connections that form the circuit function.

A gate array circuit can be programmed to implement virtually any set of functions. Input signals are processed by the programmed circuit to produce the desired set of outputs. Such inputs flow from the user's system, through input buffers, then through the circuit, and finally back out to the user's system via output buffers. Such buffers provide any or all of the following input/output (I/O) functions: voltage gain, current gain, level translation, delay, signal isolation, or hysteresis.

If the wiring channels and appropriate connections are programmed by the manufacturer according to the construction masks, then the gate array circuit is described as a mask-programmable gate array.

If the wiring channels and appropriate connections are programmed by the user according to programmable circuit elements, then the gate array circuit is described as an FPGA.

There are essentially two configurations of programmable circuit elements used to provide flexibility to the user for programming the FPGA. In the first configuration, an example of which is disclosed by El Gamal, et al. in U.S. Pat. No. 4,758,745, the FPGA can be permanently programmed by the user. In the second configuration, an example of which is disclosed by Freeman in U.S. Pat. No. 4,870,302, the FPGA can be changeably programmed by the user.

By comparison, a mask-programmable gate array offers higher functionality and performance and more efficient use of space while an FPGA offers lower design costs and greater user flexibility. Also, a mask-programmable gate array can implement any variety of I/O function and often at a higher speed than an FPGA. Other dedicated functional circuitry may also offer higher functionality and performance than its equivalent configured from FPGA components.

OBJECTS AND ADVANTAGES OF THE INVENTION

Accordingly, it is an object of the present invention to provide an improved FPGA which is capable of yielding the functionality, performance, and efficiency of a mask-programmable gate array while maintaining the lower design costs and user flexibility of an FPGA.

It is a further object of the present invention to provide an FPGA with the enhanced input/output capabilities offered by a mask-programmable gate array.

Yet another object of the present invention is to combine FPGA integrated circuit technology with that of other functional circuitry on the same integrated circuit die.

These and many other objects and advantages of the present invention will become apparent to one of ordinary skill in the art from a consideration of the drawings and ensuing description of the invention.

SUMMARY OF THE INVENTION

In accordance with the present invention, an enhanced FPGA is disclosed. A portion of an integrated circuit die includes dedicated functional circuitry or mask-programmable circuitry to provide critical circuit functions that cannot adequately or cost effectively be implemented using only Field Programmable manufacturing techniques.

A FPGA integrated circuit according to the present invention comprises a plurality of logic cells or logic modules placed in an array or matrix. The array has a set of vertical wiring channels and a set of horizontal wiring channels that are programmed by the user to interconnect the various logic cells to implement the required logic functions.

Connections to the wiring channels are made by user-programmable interconnect elements situated at the intersection of any two wires to be connected. To make a connection, the user-programmable interconnect element is programmed, resulting in a low impedance electric connection between the two wires. Various types of user-programmable interconnect elements, such as antifuses, pass transistors, memory cells, non-volatile memory including flash, EEPROMs and EPROMs, may be employed in the architecture of the present invention.

To provide more efficient utilization of the wiring channels, a plurality of these programmable elements are used to segment the vertical and horizontal channels into shorter wire lengths. These segments may be joined together to form longer wire connections by programming the programmable elements or left as is to provide independent segment wire lengths and allow the same wiring channel position to be used several times for different circuit connections.

Programming circuitry is typically situated at the edge of the array. Programming and connectivity information is shifted into the programming circuit, and appropriate voltages applied to effect the desired connection patterns. The same vertical and horizontal channels that are used for wiring channels in normal operations may be used for programming the various interconnections and to provide complete testing of the array modules and wiring paths. Alternately, direct programming of individual elements may be performed. The various circuits and processes for programming user-programmable interconnect elements are well known in the art and are not a part of the present invention. Details of programming are not presented here in order to avoid unnecessarily complicating the disclosure.

The logic modules used in the FPGA portion of the array may be universal logic elements, which are very efficient in its implementation of random logic functions defined by the use of selected user-programmable elements. Persons of ordinary skill in the art will appreciate that numerous different modules are available.

At least one portion of the array is not populated by logic modules but instead includes other circuitry. In one embodiment of the invention, the other circuitry comprises a mask-programmable circuit, such as a mask-programmable gate array. Other specific embodiments of the invention include circuits such as analog blocks (A/D, D/A, voltage reference, op amps, comparators, PLL, DPLL, DLL, crystal oscillators), specialized digital blocks (SRAM, DRAM, ROM, PROM, EPROM, EEPROM, FIFO, multiplexers, microprocessors, embedded controllers, ALU, floating point processor, DSP, array processor), and specialized I/O functions (GTL, PECL, LVDS, bus controllers for PCI, ISA, EISA, RAMBUS, etc., network transceivers, high speed serial connections).

Interface circuitry allows connections to be made between the mask-programmable circuit, the logic modules in the array, and I/O circuitry connecting to I/O pins on the integrated circuit. According to one aspect of the present invention, one or more logic module locations at or near the interface between the FPGA portion and the mask-programmable portion of the integrated circuit are populated by interface circuits for making connections between FPGA portion and the mask-programmable portion of the integrated circuit.

The end user chooses from a wide range of functions and specifies them to the manufacturer. The manufacturer in turn programs some functions into the integrated circuit using mask-programmable techniques, leaving the user to program other functions into the integrated circuit using the field programmable portion of the integrated circuit.

In one embodiment of the present invention, the mask-programmable portion of the integrated circuit contains a gate array for implementing a wide range of functions. The mask-programmable gate array is connected to the FPGA via a circuit interface portion of the integrated circuit. The circuit interface can contain either mask-programmable or Field Programmable circuits for controlling and processing the signals passing from and to both the mask-programmable gate array and the FPGA. Each of the mask-programmable gate array, the FPGA, and the circuit interface are connected to an I/O portion of the integrated circuit. The I/O portion of the integrated circuit can contain either mask-programmable or Field Programmable circuits for controlling and processing the signals passing into the integrated circuit from external sources or out of the integrated circuit to external sources.

In an alternative embodiment of the present invention, the mask-programmable portion of the integrated circuit contains I/O circuits for implementing a wide range of functions for controlling and processing the signals passing into the integrated circuit from external sources or out of the integrated circuit to external sources. The mask-programmable I/O circuits are connected to the FPGA via a circuit interface portion of the integrated circuit. The circuit interface can contain either mask-programmable or Field Programmable circuits for controlling and processing the signals passing from and to the FPGA. Both the circuit interface and the FPGA can also receive signals from and send signals to external sources directly.

Those skilled in the art will recognize the general applicability of the mask-programmable enhanced FPGA disclosed herein to other types of circuits, both analog and digital.

DESCRIPTION OF THE PREFERRED EMBODIMENTS

One of ordinary skill in the art will realize that the following description of the present invention is illustrative only and is not intended to be in any way limiting. Other embodiments of the invention will readily suggest themselves to such a skilled person from an examination of the within disclosure.

Figure 1:
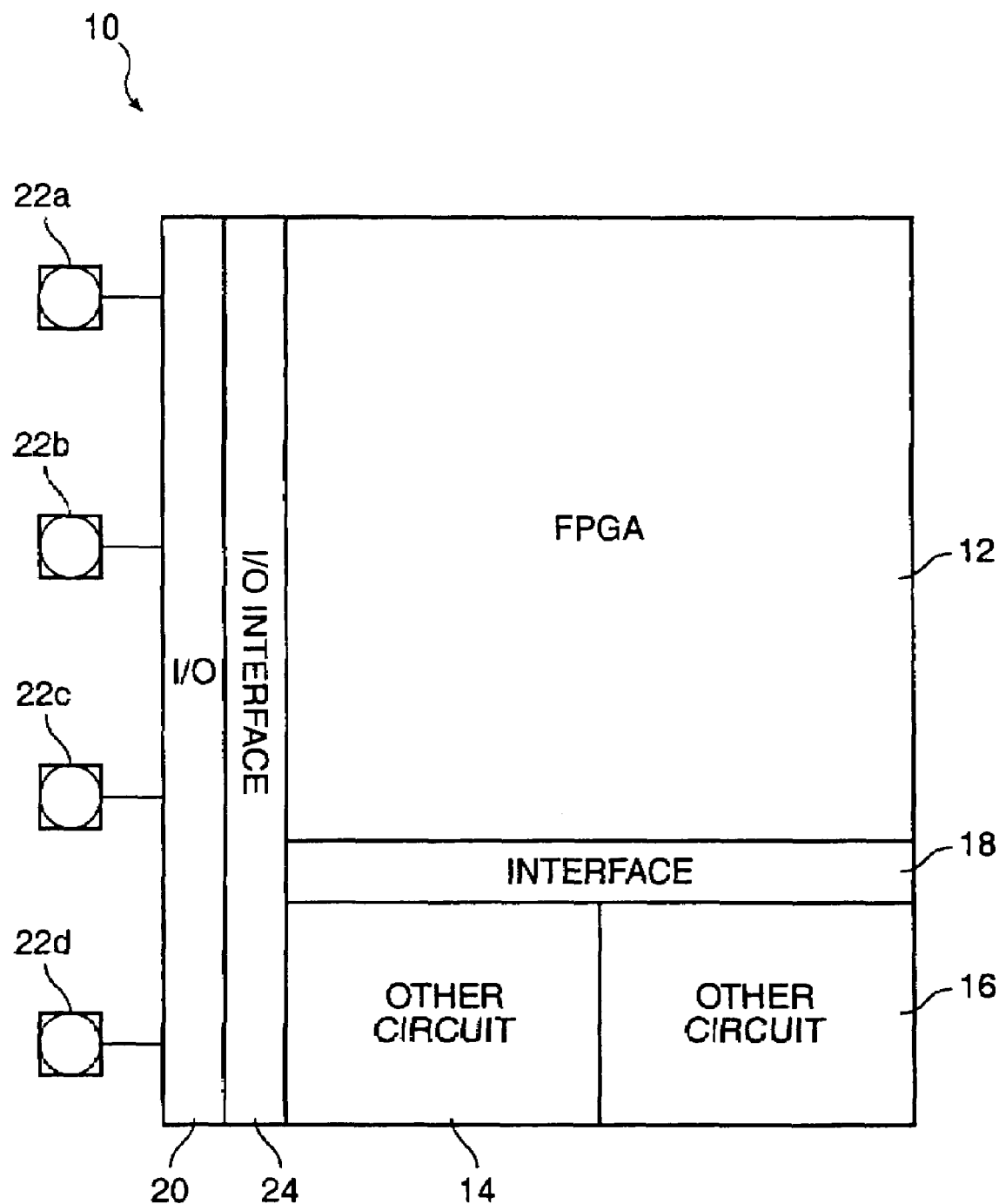
FIG. 1 is a block diagram of a preferred embodiment of the present invention having both an FPGA region and a mask-programmable gate array region.

Referring first to FIG. 1, a block diagram of a preferred embodiment of an enhanced FPGA integrated circuit 10 is shown. The integrated circuit 10 is shown to comprise a number of blocks. The number, size, and location of the blocks as shown in FIG. 1 is not critical to the operation of the present invention and the layout shown in FIG. 1 is only for purposes of illustration. Persons of ordinary skill in the art will realize that a large number of alternative implementations are possible which are included within the scope of the present invention.

First, the integrated circuit 10 contains an FPGA portion 12. The FPGA 12 includes an array of logic function modules and uncommitted wiring channels which are connectable together and to I/O of the integrated circuit 10 via user-programmable interconnect elements as is known in the art. The end user may configure the FPGA 12 to perform a wide range of functions into the integrated circuit 10. The techniques used to implement user defined functions employing an FPGA are well known to persons of ordinary skill in the art and will not be further disclosed herein.

In addition, the integrated circuit 10 includes regions 14 and 16 of other circuitry. For disclosure of the illustrative embodiment disclosed herein, the other circuitry is a mask-programmable gate array. Persons of ordinary skill in the art will recognize from this disclosure that many other types of circuitry can be employed in regions 14 and 16, subject only to compatibility with the FPGA fabrication process. The number of other types of circuit functions which could be employed in regions 14 and 16 is thus virtually unlimited. Persons of ordinary skill in the art will also appreciate that while two regions 14 and 16 are shown in the block diagram of FIG. 1, one such region, or more than two regions could be included in an integrated circuit according to the present invention.

The mask-programmable gate arrays in regions 14 and 16 includes an array of uncommitted gates with uncommitted wiring channels. During manufacturing, these gates are connected together within the mask-programmable gate array regions 14 and 16 to implement any of a wide range of functions into the integrated circuit 10. The functions programmed into the mask-programmable gate array regions 14 and 16 are generally dictated by the user or reflect an industry standard. The techniques used to implement functions employing a mask-programmable gate array are well known to one of ordinary skill in the art and will not be further disclosed herein.

The integrated circuit 10 includes an interface region 18. The interface region 18 includes any number and variety of elements, which provide communication between the FPGA portion 12, the mask-programmable gate array regions 14 and 16, and the I/O of the integrated circuit 10. The circuit interface elements can be as simple as a direct interconnect between the FPGA region 12 and the mask-programmable gate array regions 14 and 16 or as complicated as a logic module that controls and/or conditions the communication between the FPGA region 12 and the mask-programmable gate array regions 14 and 16. The choice of circuit interface elements is generally dictated by the nature of the circuitry disposed in regions 14 and 16 and in the FPGA region 12. The techniques used to implement the circuit interface elements are dictated in part by the techniques used to implement the functions in the FPGA 12 and the mask-programmable gate array regions 14 and 16. The techniques used to implement the circuit interface elements are well known to one of ordinary skill in the art and will not be further disclosed herein.

A distributed approach is preferably taken for placement of the I/O connections to the regions 14 and 16 through the matrix of logic modules in the software library used to configure the FPGA portion 12 of integrated circuit 10. In some implementations, fixed locations, i.e., logic modules, are defined to be connectable to the regions 14 and 16 in as even a manner as the layout will allow. In other implementations, FPGA routing resources may be brought out to be connectable to the regions 14 and 16 in as even a manner as the layout will allow.

The integrated circuit 10 also includes an I/O section 20. The I/O section 20 provides the necessary elements for communication between the integrated circuit 10 and other components in an external system. While I/O section 20 is shown at a single location in the block diagram of FIG. 1, persons of ordinary skill in the art will recognize that for efficient use, the I/O 20 may be distributed around the area of the die on which integrated circuit 10 is fabricated.

The physical connection with the external user is provided through bonding pads 22a, 22b, 22c, and 22d. One of ordinary skill in the art will realize that the number and location of the bonding pads 22a, 22b, 22c, and 22d can vary widely with the particular application necessary for the operation of the present invention.

The bonding pads 22a, 22b, 22c, and 22d are connected to the I/O section 20. I/O section 20 is connected to I/O interface 24 which includes any number and variety of mask-programmable and/or field programmable elements which provides communication between the external user and any or all of the FPGA region 12, the mask-programmable gate array regions 14 and 16, and the circuit interface 18 located on the integrated circuit 10. The I/O interface elements can be as simple as a direct interconnect between the external user and the integrated circuit 10 or as complicated as a logic module that controls and/or conditions the communication between the external user and the integrated circuit 10. The choice of I/O interface elements is generally dictated by the user or reflect an industry standard. The techniques used to implement the I/O interface elements are well known to one of ordinary skill in the art and will not be further disclosed herein.

The increase in performance and functionality of the mask-programmable enhanced FPGA as shown in FIG. 1 is such that a broad range of uses are possible. Some specific uses will now be disclosed, but they by no means represent the full extent of those uses that are possible within the present invention.

For example, three-state buffers can be programmed into the circuit interface 18 by either Field Programmable or mask-programmable techniques. These three-state buffers can then be utilized to isolate the FPGA region 12 from the mask-programmable gate array 14 and/or vice versa during test or normal operation as desired.

Alternatively, transistors such as high voltage pass gates can be programmed into the circuit interface 18 and used for isolation. In either case, the state of the isolation can be determined by the external user through the I/O section 20 by selectively turning the isolation on or off.

Another use for either one of mask-programmable gate array regions 14 or 16 is to configure it as a decryption circuit. This decryption circuit receives encrypted configuration data from the external user, decrypts this data, and passes the decrypted data on to the FPGA region 12. Those of ordinary skill in the art will appreciate that, for this purpose, mask-programmable gate array region 14 or 16 may be configured as one of numerous known decryption circuits.

If one of mask-programmable gate array regions 14 or 16 has been configured as a decryption circuit, the FPGA region 12 of the integrated circuit is programmed with a configuration control circuit that receives the decrypted configuration data and utilizes it to configure the programmable elements of the FPGA 12 to perform the function desired by the external user. In this way, the configuration of the FPGA 12 can be maintained in confidence from everyone except the persons who generated the encrypted configuration data. This is especially useful if the FPGA 12 employs any of the known user re-programmable interconnect elements.

The ability to reprogram the changeably programmable circuit elements in the FPGA 12 is another use that the mask-programmable gate array regions 14 and 16 can be programmed to fulfill. First, this enables a function performed by the FPGA region 12 to be changed based on established criteria. Second, this allows the FPGA region 12 to be programmed in such a way that a function performed by the mask-programmable gate array 14 is changed.

In addition to reprogramming the FPGA 12, the mask-programmable gate array regions 14 and 16 can be programmed with a built-in test sequence for testing the FPGA 12 on command from the external user or automatically on startup. Numerous such test circuits are known to persons of ordinary skill in the art.

The mask-programmable gate array regions 14 and 16 can also be employed to provide a standardized interfaces between the external user and the FPGA 12. First, the mask-programmable gate array regions 14 and 16 can perform bus interface functions such as PCI, VME, or USB. Second, the mask-programmable gate array regions 14 and 16 can perform local area network (LAN) functions such as Ethernet, Frame Relay, and ATM.

Another use for either one of the mask-programmable gate array regions 14 and 16 is to configure it to be a microprocessor or embedded controller such as one of the numerous popular designs in use in the industry.

In the situation where the FPGA 12 has been programmed with a high fanout load, the mask-programmable gate array regions 14 and 16 can be programmed with a high drive, low skew clock driver for connecting to the high fanout load. Low skew clock driver circuits are well known in the art.

The process employed to create and to program the mask-programmable enhanced FPGA as shown in FIG. 1 is based on a combination of techniques that are well known to one of ordinary skill in the art. The general process is outlined below.

To begin with, the general need that the integrated circuit 10 is to fulfill is determined. This may be based entirely on specifications supplied by a user or group of users or on a decision made solely by the manufacturer based upon market analysis.

Next the manufacturer lays out the details of the integrated circuit 10 making sure to allow as much flexibility as possible. This involves selecting the relative sizes of the blocks of the integrated circuit 10 and the logic circuits that will be available within each block. The manufacturer then fabricates the integrated circuit 10 and programs some functions into the integrated circuit 10 using mask-programmable techniques. These functions can be as simple as an interconnect or as complicated as a standard interface or microprocessor.

The integrated circuit 10 is then either shipped to the user who programs additional functions into the integrated circuit 10 using the user-programmable interconnect elements. Persons of ordinary skill in the art will appreciate that the mask programming step could be performed to individual user specifications. The result of the programming is an integrated circuit 10 that contains a circuit that will perform an enhanced user defined function.

If the integrated circuit 10 includes reconfigurable user-programmable elements, the final configuration of the integrated circuit can be changed by either the manufacturer or the user and the resulting function may also be changed. This results in a more flexible integrated circuit.

According to another aspect of the present invention, the regions 14 and 16 may be programmed to operate in one of a number of predefined modes by configuring them. In a programming mode, one or more I/O pins of the integrated circuit may be used to configure the function of the regions 14 and 16. In an operating mode, these I/O pins may be used for normal I/O functions. Assigning dual functions to I/O pins is well known in the art.

In addition, the regions 14 and 16 may be disabled, allowing the integrated circuit to be sold as an FPGA alone. If these regions are not recognized as being present by the programming software, no circuitry appears in the net list describing the integrated circuit.

Figure 2:
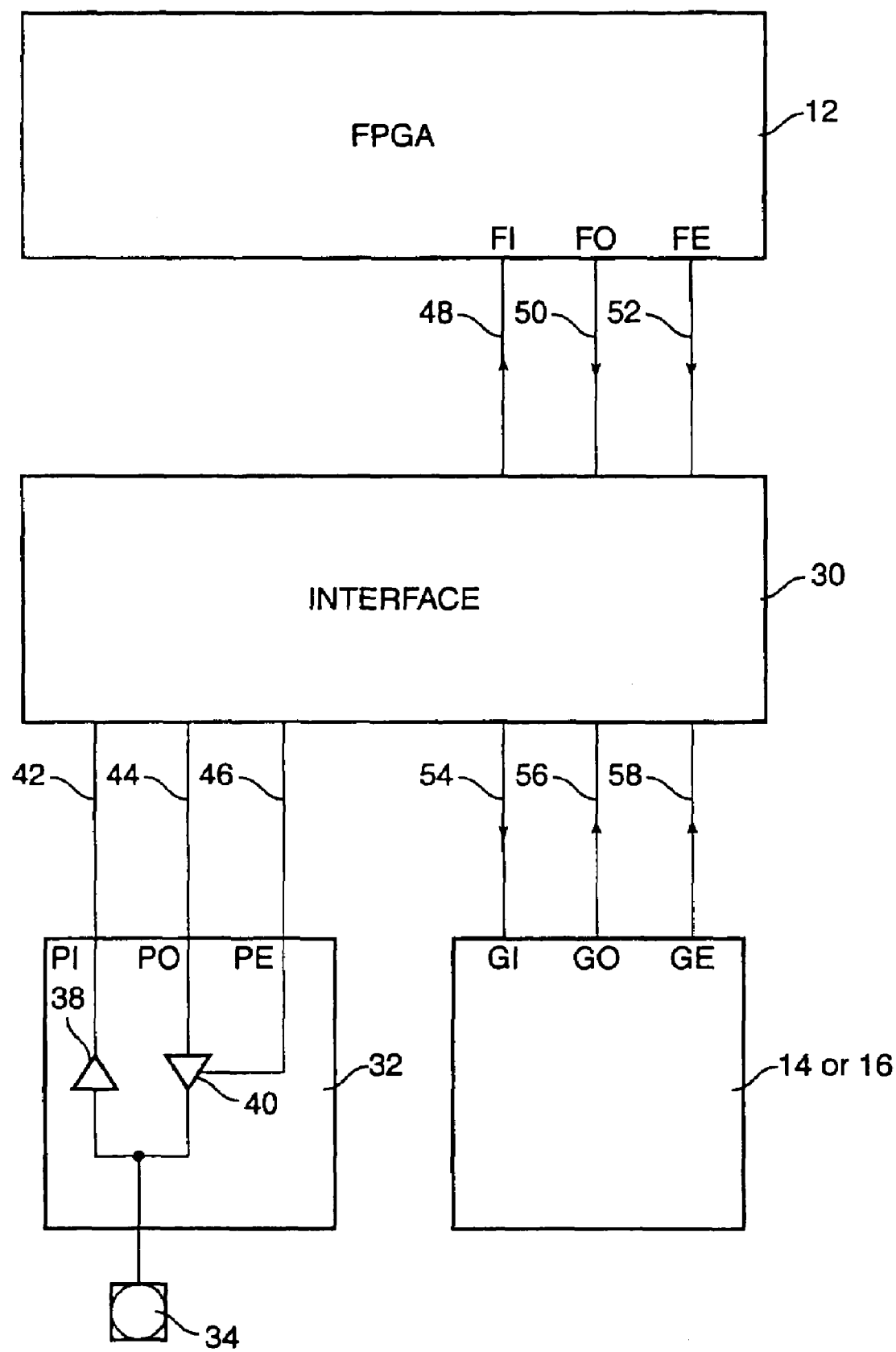
FIG. 2 is a block diagram of a preferred embodiment of an interface circuit according to the present invention interposed between the FPGA region, the mask-programmable region, and an I/O driver of the integrated circuit.

Referring now to FIG. 2, a block diagram is presented of a preferred embodiment of an interface circuit 30 according to the present invention for use between the FPGA region 12, one of mask-programmable regions 14 or 16, and an I/O driver 32 of the integrated circuit. Interface circuit 30 may be used for each I/O pin 34 which has direct access to the mask-programmable regions 14 or 16.

I/O pad 34 is driven from or drives pad driver circuit 32 depending on whether the I/O pad 34 is functioning as an input or an output of the integrated circuit 10. As will be appreciated by those of ordinary skill in the art, pad driver circuit 32 comprises a bidirectional buffer including input buffer 38 and tri-stateable output buffer 40. The three signal lines associated with pad driver circuit 32 are pad input (PI) line 42, pad output (PO) line 44, and pad enable (PE) line 46. PI line 42 carries input signals from the output of input buffer 38, PO line 44 carries output signals to the input of output buffer 40, and PE line 46 is the tri-state control for output buffer 40. The operation of pad driver circuit 32 is well known in the art.

According to the present invention, interface circuit 30 provides a way to allow pad driver circuit 32 to communicate with both FPGA portion 12 and mask-programmable regions 14 or 16 of integrated circuit 10. Each of FPGA portion 12 and mask-programmable regions 14 or 16 has three signal lines associated with it. FPGA portion 12 has signal input (FI) line 48, signal output (FO) line 50, and signal enable (FE) line 52. FI line 48 carries input signals into FPGA portion 12, FO line 50 carries output signals from FPGA portion 12, and FE line 52 is a tri-state control line. Mask-programmable regions 14 and 16 have three signal lines associated with them: signal input (GI) line 54, signal output (GO) line 56, and signal enable (GE) line 58. GI line 54 carries input signals into mask programmable region 14 or 16, GO line 56 carries output signals from mask-programmable region 14 or 16, and GE line 58 is a tri-state control line. Persons of ordinary skill in the art will recognize that an interface 30 may be provided for each I/O of the integrated circuit 10.

Figure 3:
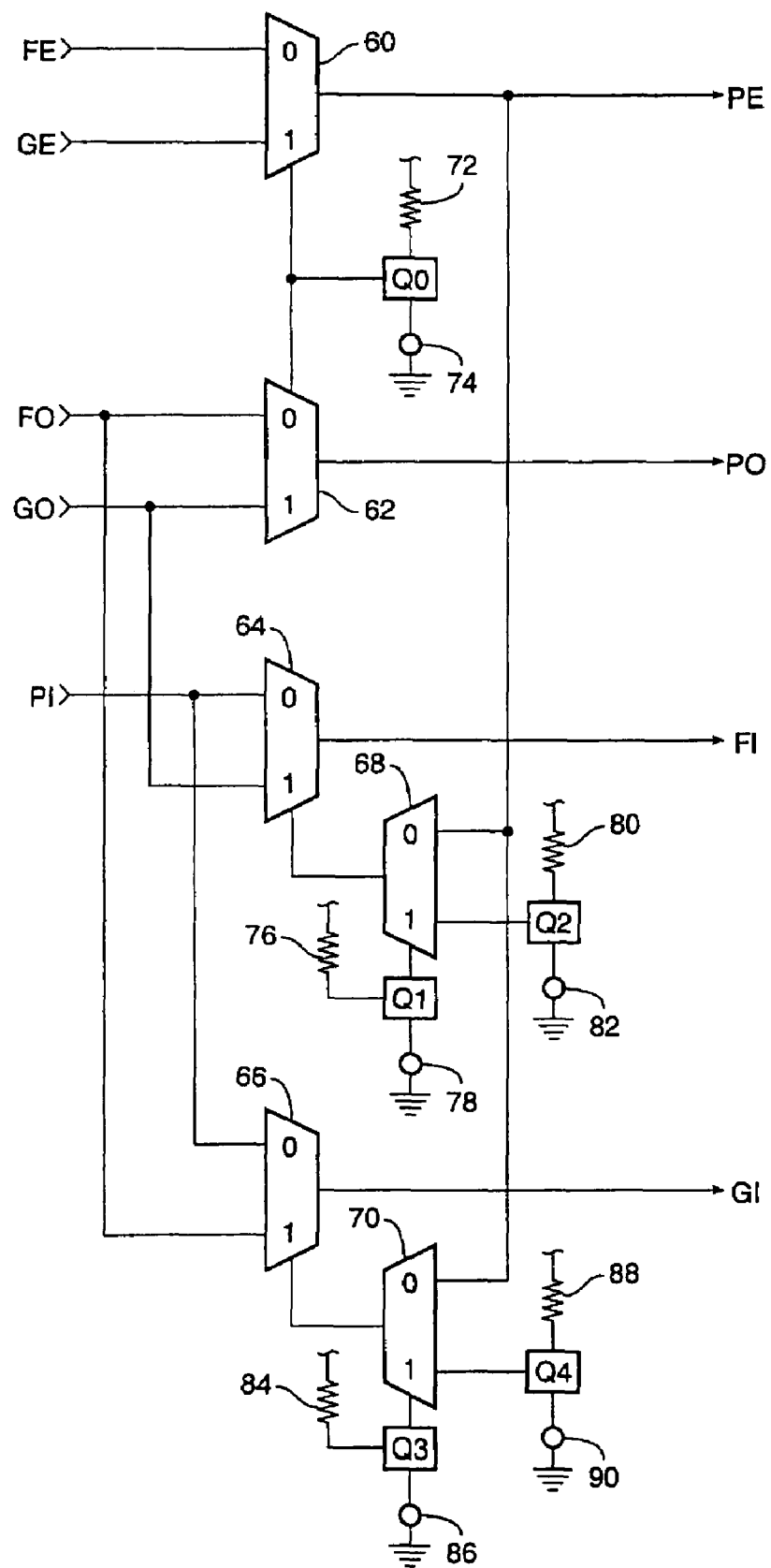
FIG. 3 is a schematic diagram of a presently preferred embodiment of the interface circuit of FIG. 2.

Referring now to FIG. 3, a schematic diagram of a presently preferred embodiment of the interface circuit 30 of FIG. 2 is presented. A first multiplexer 60 has a control input driven by a control signal Q0, a first data input driven by the FE signal, a second data input driven by the GE input signal, and an output presenting the PE signal. A second multiplexer 62 has a control input driven by the control signal Q0, a first data input driven by the FO signal, a second data input driven by the GO input signal, and an output presenting the PO signal. A third multiplexer 64 has a control input, a first data input driven by the PI signal, a second data input driven by the GO input signal, and an output presenting the FI signal. A fourth multiplexer 66 has a control input, a first data input driven by the PI signal, a second data input driven by the FO input signal, and an output presenting the GI signal.

First through fourth multiplexers 60, 62, 64, and 66 are preferably formed using tri-state buffers rather than pass transistors. The use of these tri-state buffers allows for driving long lines.

A fifth multiplexer 68 has a control input driven by a control signal Q1, a first data input driven by the PE signal, a second data input driven by a control signal Q2, and an output driving the control input of the third multiplexer 64. A sixth multiplexer 70 has a control input driven by a control signal Q3, a first data input driven by the PE signal, a second data input driven by the Q4 input signal, and an output driving the control input of the fourth multiplexer 66.

Control bit QO allows either the FPGA region 12 or the mask-programmable region 14 or 16 to control the tri-stateable output buffer 40 by selecting either the FO and FE lines or the CO and GE lines as the source for the PO and PE lines, respectively.

Control bits Q1 and Q2 allow the FI Input to the FPGA region 12 to be sourced by either the GO or the PI signal. If Q1=1, the selection is static depending on the state of the Q2 control bit. If Q1=0, the F1 source selection is dynamic depending on the value of PE. This is useful when Q0=1

(i.e., the mask programmable gate array region 14 or 16 is programmed to control the tri-stateable output buffer 40), because it allows the FPGA region 12 to monitor external data which may be brought into the integrated circuit by means of input buffer 38 and PI when the tri-stateable output buffer 40 is disabled (PE=0) and to monitor internal data which may be leaving the integrated circuit by means of GO and tri-stateable output buffer 40 when it is enabled (PE=I).

In a similar manner, control bits Q3 and Q4 allow the GI input to the mask-programmable gate array region 12 to be sourced by either the FO or the PI signal. If Q3=1, the selection is static depending on the state of the Q4 control bit. If Q3=0, the GI source selection is dynamic depending on the value of PE. This is useful when Q0=0 (i.e., the FPGA region 12 is programmed to control the tri-stateable output buffer 40), because it allows the mask-programmable region 14 or 16 to monitor external data which may be brought into the integrated circuit by means of input buffer 38 and PI when the tri-stateable output buffer 40 is disabled (PE=0) and to monitor internal data which may be leaving the integrated circuit by means of FO and tri-stateable output buffer 40 when it is enabled (PE=I).

The Q0 through Q4 control bits may be controlled by user-programmable interconnect elements which may be selectively programmed during FPGA device programming by the end user. For example, each of the Q0 through Q4 nodes may separately be actively or passively pulled up unless pulled down by programming a user-programmable interconnect element associated therewith.

Thus, node Q0 is illustratively shown connected to VDD through pullup device 72 and to ground through user-programmable interconnect element shown as a circle identified by reference numeral 74. Node Q1 is illustratively shown connected to VDD through pullup device 76 and to ground through user-programmable interconnect element shown as a circle identified by reference numeral 78. Node Q2 is illustratively shown connected to VDD through pullup device 80 and to ground through user-programmable interconnect element shown as a circle identified by reference numeral 82. Node Q3 is illustratively shown connected to VDD through pullup device 84 and to ground through user-programmable interconnect element shown as a circle identified by reference numeral 86. Node Q4 is illustratively shown connected to VDD through pullup device 88 and to ground through user-programmable interconnect element shown as a circle identified by reference numeral 90.

Tables 1 and 2 are truth tables defining the operation of the interface 30.

TABLE 1

FI OPERATION

| Q0 | Q1 | Q2 | COMMENTS |
|---|---|---|---|
| 0 | 0 | 0 | Unused |
| 0 | 0 | 1 | Unused |
| 0 | 1 | 0 | FPGA input FI always from I/O pad input PI |
| 0 | 1 | 1 | FPGA input FI always from gate array output GO |
| 1 | 0 | 0 | Tri-state signal controlled from gate array; FPGA |
| 1 | 0 | 1 | Unused |
| 1 | 1 | 0 | FPGA input FI always from I/O pad input PI |
| 1 | 1 | 1 | FPGA input FI always from gate array output GO |

TABLE 2

GI OPERATION

| Q0 | Q3 | Q4 | COMMENTS |
|---|---|---|---|
| 0 | 0 | 0 | Tri-state signal controlled from Gate Array; FPGA |
| 0 | 0 | 1 | Unused |
| 0 | 1 | 0 | Gate array input GI always from I/O pad input PI |
| 0 | 1 | 1 | Gate array input GI always from FPGA output FO |
| 1 | 0 | 0 | Unused |
| 1 | 0 | 1 | Unused |
| 1 | 1 | 0 | Gate Array input GI always from I/O pad input PI |
| 1 | 1 | 1 | Gate array input GI always from FPGA output FO |

The Q0 through Q4 control signals may also be controlled from registers so as to alter the signal path definitions as a function of time as is known the art.

Figure 4:
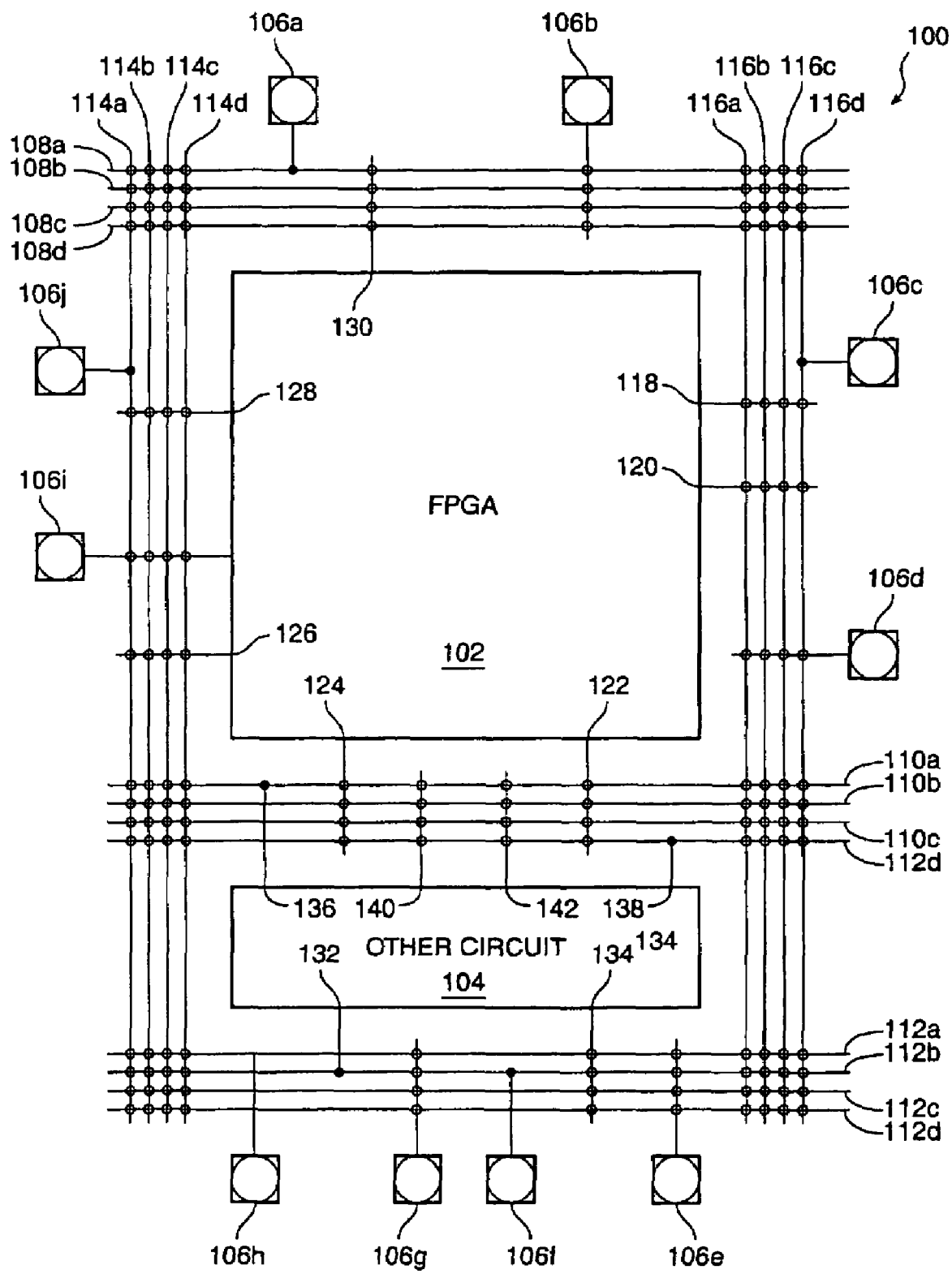
FIG. 4 is a block diagram of an embodiment of the present invention having both an FPGA region and a mask-programmable gate array region showing an illustrative I/O routing arrangement.

FIG. 4 is a block diagram of a preferred embodiment of an integrated circuit 100 according to the present invention having both an FPGA region 102 and another circuit region 104 which may be, for example, a mask-programmable gate array region. FIG. 4 shows another illustrative I/O routing arrangement for use in the present invention.

A plurality of I/O pads 106a through 106j are disposed about the periphery of the integrated circuit die as is well known in the art. Those of ordinary skill in the art will recognize that I/O buffers (not shown in FIG. 4) may be provided.

In addition, a plurality of wiring channels is disposed on the integrated circuit. Each wiring channel includes a plurality of interconnect conductors. Several such wiring channels are shown in FIG. 4 disposed in both the horizontal and vertical directions. Those of ordinary skill in the art will recognize, however, that many more wiring channels than are shown in FIG. 4 will typically exist in an integrated circuit fabricated according to the teachings of the present invention.

For example, three horizontal wiring channels are shown. The uppermost horizontal wiring channel includes interconnect conductors 108a through 108d. The center horizontal wiring channel includes interconnect conductors 110a through 110d. The lower horizontal wiring channel includes interconnect conductors 112a through 112d.

In addition, two vertical wiring channels are shown in FIG. 4. The leftmost vertical wiring channel includes interconnect conductors 114a through 114d. The rightmost vertical wiring channel includes interconnect conductors 116a through 116d.

Although not shown in the figure, persons of ordinary skill in the art will appreciate that the interconnect conductors can have varying lengths. Some run the full length (or width) of the array and some are segmented into at least two segments in order to maximize the interconnect capability of the integrated circuit 100.

According to the aspect of the invention depicted in FIG. 4, some of the I/O pads 106a through 106j are hardwired to interconnect conductors and some are programmably connectable to interconnect conductors. I/O pads 106a, 106c, 106f, 106h and 106j are hardwired to interconnect conductors 108a, 116d, 112b, 112a, and 114d, respectively. I/O pads 106b, 106d, 106e, 106g, and 106i are programmably connectable to any of the interconnect conductors in the wiring channels that their conductors intersect. For example, I/O pad 106b is connectable to any of interconnect conductors 108a through 108d via individual user-programmable interconnect elements shown as small circles at the regions where the I/O pad conductor intersects the interconnect conductors.

In addition, the individual interconnect conductors in intersecting wiring channels are programmably connectable to one another via individual user-programmable interconnect elements shown as small circles at the regions where the interconnect conductors intersect one another. For example, interconnect conductors 108a through 108d are programmably connectable to any of interconnect conductors 114a through 114d or any of interconnect conductors 116a through 116d.

Inputs and outputs of individual logic function modules in the FPGA portion 102 of integrated circuit 100 are programmably connectable to the interconnect conductors in the same manner as described above. Illustrative inputs or outputs 118, 120, 122, 124, 126, 128, and 130 are shown intersecting various wiring channels and are shown connectable to individual interconnect conductors contained therein via user-programmable interconnect elements shown as small circles.

The inputs and outputs of other circuit region 104 of integrated circuit 100 has two types of connectivity to the I/O pads 106a through 106j. For example, input/output 132 is hardwired to an interconnect conductor 112b, which is hardwired to I/O pad 106f. Input/output 134 is programmably connectable to any one of interconnect conductors 112a through 112d and thus is also programmably connectable to I/O pad 106e via user-programmable interconnect elements.

Input/outputs 136 and 138 of other circuit region 104 are hardwired to interconnect conductors 110a and 110d, respectively, and input/outputs 140 and 142 of other circuit region 104 are programmably connectable to any one of interconnect conductors 110a through 110d, all via user-programmable interconnect elements.

While illustrative embodiments and applications of this invention have been shown and described, it would be apparent to one of ordinary skill in the art that many more modifications than have been mentioned above are possible without departing from the inventive concepts set forth herein. The invention, therefore, is not to be limited except in the spirit of the appended claims.

What is claimed is:

1. An integrated circuit device comprising:
   at least one field programmable gate array region and at least one mask-programmable gate array region;
   an I/O system including I/O pads and associated driver circuits and an I/O interface including mask programmable elements; and
   a user-programmable interconnect architecture for selectively making connections between said at least one field programmable gate array region, said at least one mask-programmable gate array region and said I/O system.

2. The integrated circuit device of claim 1 wherein the field programmable gate array region includes an array of universal programmable logic elements.

3. The integrated circuit system of claim 1 wherein the programmable elements in the I/O interface include direct interconnects.

4. The integrated circuit system of claim 1 wherein the programmable elements in the I/O interface include logic modules that control communication to and from the integrated circuit.

5. The integrated circuit system of claim 1 wherein the programmable elements in the I/O interface are field programmable elements.

6. The integrated circuit system of claim 1 further including a circuit interface between the field programmable gate array region and the mask programmable gate array region.

7. The integrated circuit system of claim 6 wherein tri-state buffers are programmable into the circuit interface between the field programmable gate array region and the mask programmable gate array region.

8. The integrated circuit system of claim 7 wherein high-voltage pass gates are programmable into the circuit interface between the field programmable gate array region and the mask programmable gate array region.

9. The integrated circuit system of claim 1 wherein the mask programmable gate array region is configurable as a decryption circuit.

10. The integrated circuit system of claim 1 wherein the mask programmable gate array region are programmable with a built-in test sequence for the field programmable gate array region.

11. The integrated circuit system of claim 1 wherein the mask programmable gate array region is configurable as a standardized interface between the field programmable gate array region and off-chip.

12. The integrated circuit system of claim 11 wherein the mask programmable gate array region is configurable as a bus interface.

13. The integrated circuit system of claim 12 wherein the mask programmable gate array region is configurable as a PCI bus.

14. The integrated circuit system of claim 12 wherein the mask programmable gate array region is configurable as a VME bus.

15. The integrated circuit system of claim 12 wherein the mask programmable gate array region is configurable as a USB bus.

16. The integrated circuit system of claim 11 wherein the mask programmable gate array region is configurable to perform a local area network function.

17. The integrated circuit system of claim 16 wherein the mask programmable gate array region is configurable to perform an Ethernet function.

18. The integrated circuit system of claim 16 wherein the mask programmable gate array region is configurable to perform a frame relay function.

19. The integrated circuit system of claim 16 wherein the mask programmable gate array region is configurable to perform an ATM function.

20. The integrated circuit system of claim 1 wherein the mask programmable gate array region is configurable as a high-drive, low skew clock driver for the field programmable gate array region.

* * * * *